United States Patent
Matsumura

(10) Patent No.: US 7,829,995 B2
(45) Date of Patent: Nov. 9, 2010

(54) SEMICONDUCTOR DEVICE AND METHOD OF FABRICATION

(75) Inventor: Kazuhiko Matsumura, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/425,682

(22) Filed: Apr. 17, 2009

(65) Prior Publication Data
US 2009/0278248 A1    Nov. 12, 2009

(30) Foreign Application Priority Data

| May 9, 2008 | (JP) | ............................. 2008-123674 |
| Feb. 12, 2009 | (JP) | ............................. 2009-029623 |

(51) Int. Cl.
*H01L 23/02* (2006.01)

(52) U.S. Cl. ....................... 257/686; 257/687; 257/777; 257/E25.006; 257/E25.013

(58) Field of Classification Search ................. 257/666, 257/686, 687, 777, 787, E25.006, E25.013, 257/E23.06
See application file for complete search history.

(56) References Cited
U.S. PATENT DOCUMENTS

| 5,719,436 A | 2/1998 | Kuhn |
| 6,495,908 B2 | 12/2002 | Yang et al. |
| 6,590,279 B1 * | 7/2003 | Huang et al. ................. 257/676 |
| 2007/0158682 A1 | 7/2007 | Terao |
| 2008/0054433 A1 | 3/2008 | Yoo et al. |

FOREIGN PATENT DOCUMENTS

| JP | 2005-347428 | 12/2005 |
| JP | 2006-245215 | 9/2006 |
| JP | 2008-028006 | 2/2008 |

* cited by examiner

*Primary Examiner*—Hoai v Pham
(74) *Attorney, Agent, or Firm*—McDermott Will & Emery LLP

(57) ABSTRACT

A semiconductor device includes a first die pad, a first semiconductor chip provided on the first die pad, a second die pad, a second semiconductor chip provided on the second die pad, and a sealing resin made of a first resin material, sealing the first die pad, the first semiconductor chip, the second die pad and the second semiconductor chip. A lower surface of the first semiconductor chip is connected to the first die pad. A first portion of a lower surface of the second semiconductor chip is connected to the second die pad, and a second portion not connected to the second die pad of the lower surface of the second semiconductor chip is connected to an upper surface of the first semiconductor chip via a second resin material different from the first resin material.

7 Claims, 11 Drawing Sheets

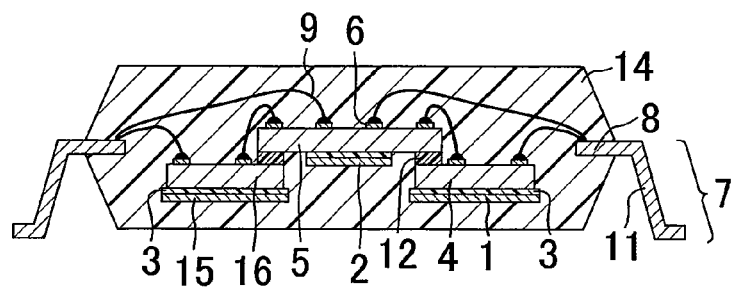
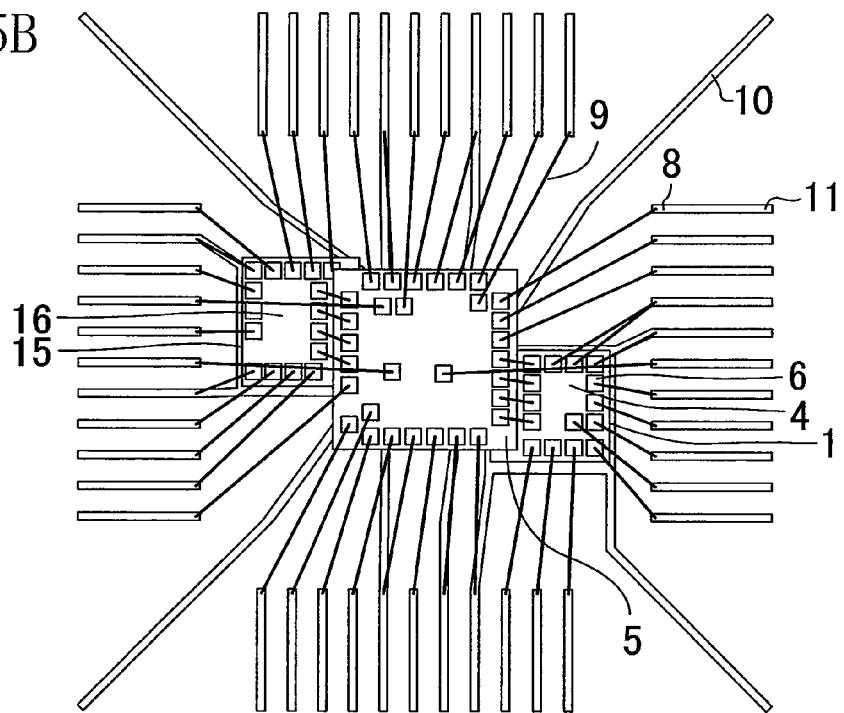
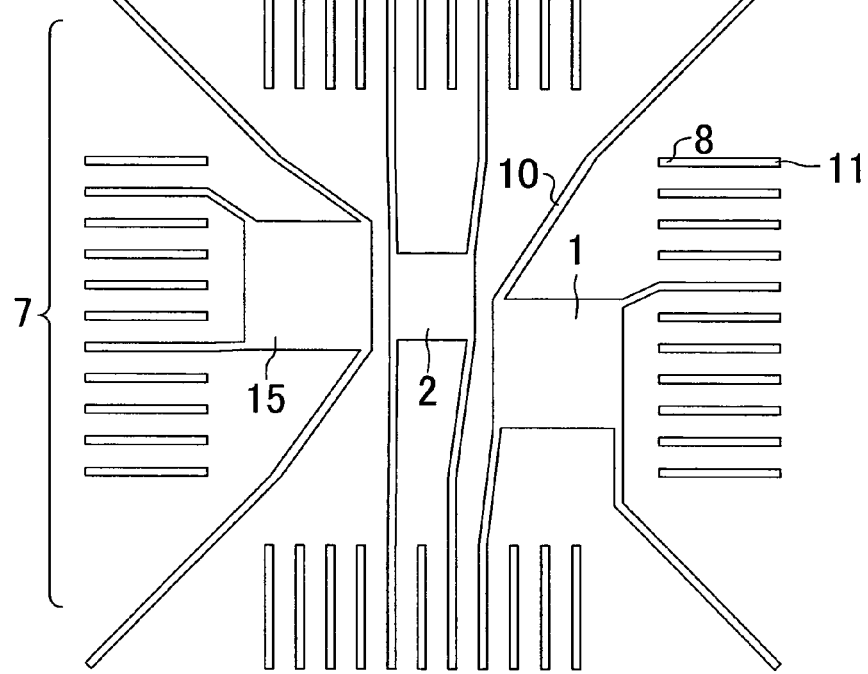

SEMICONDUCTOR DEVICE AND METHOD OF FABRICATION

CROSS REFERENCE TO RELATED APPLICATIONS

This application claims priority under 35 U.S.C. § 119(a) on Patent Application No. 2008-123674 filed in Japan on May 9, 2008, and Patent Application No. 2009-029623 filed in Japan on Feb. 12, 2009, the entire contents of which are hereby incorporated by reference.

BACKGROUND

The present disclosure relates to a semiconductor device including a plurality of semiconductor chips within the same package.

In recent years, as electronic apparatuses that have more functions and are smaller in size have been developed, semiconductor devices used therein have also been caused to be more multifunctional and thinner. The development of a semiconductor device including a plurality of semiconductor chips within the same package has been required. To achieve such a purpose, there is a conventional known semiconductor device having a structure in which a plurality of semiconductor chips are provided on the same die pad, or a structure in which a plurality of die pads are provided within the same package, and further, a plurality of semiconductor chips are provided on the respective die pads.

Hereinafter, a structure of a conventional semiconductor device, specifically, a Quad Flat Package (QFP package) having a plurality of die pads within the same package, will be described with reference to FIGS. 10A and 10B and 11A to 11E.

FIGS. 10A and 10B are cross-sectional views of a structure of a QFP package as a conventional semiconductor device.

In the conventional QFP package of FIGS. 10A and 10B, die pads 101 and 102 are formed within the same package. The die pads 101 and 102 have a Point Support Die pad (PSD) structure. A semiconductor chip 104 is electrically connected via an electrically conductive resin 103 to the die pad 101. A semiconductor chip 105 is electrically connected via the electrically conductive resin 103 to the die pad 102. Electrodes 106 on the semiconductor chips 104 and 105 are electrically connected via gold wires 109 to inner leads 108 of a lead frame 107 that is a part of the package. The semiconductor chips 104 and 105 are also electrically connected to each other via gold wires 109 so that they can exchange information. The resultant structure is sealed with a sealing resin, which forms an outer shape of the semiconductor device.

As can be seen from FIGS. 10A and 10B, in the conventional QFP package having the structure described above, the die pads 101 and 102 are positioned at different heights, but not at the same height. Thus, in a PSD structure in which semiconductor chips provided on die pads have larger sizes than those of the respective die pads, the arrangement of the die pads at different heights allows portions of semiconductor chips extending off the respective upper and lower die pads to three-dimensionally overlap each other, as shown in FIG. 10B. Therefore, an area occupied by all of the semiconductor chips within the package is reduced, so that the package can be reduced in size.

Next, a method for fabricating a conventional semiconductor device (QFP package) will be described.

FIGS. 11A to 11E are cross-sectional views schematically showing the conventional semiconductor device (QFP package) fabricating method.

Initially, as shown in FIG. 11A, an electrically conductive resin 103 is applied onto die pads 101 and 102.

Next, as shown in FIG. 11B, semiconductor chips 105 and 106 are mounted onto the die pads 101 and 102, respectively, with the electrically conductive resin 103 being interposed therebetween. When the semiconductor chips 105 and 106 have regions overlapping each other, the semiconductor chips 105 and 106 will be damaged if the semiconductor chips 105 and 106 contact each other. Therefore, in order to prevent from the semiconductor chips 105 and 106 from contacting each other, the semiconductor chips 105 and 106 need to be carefully isolated from each other in a region where the semiconductor chips 105 and 106 three-dimensionally overlap each other. After the semiconductor chips 105 and 106 are mounted, the electrically conductive resin 103 is cured in a curing furnace (not shown).

Next, as shown in FIG. 11C, gold wires 109 connecting a lead frame 107 and the semiconductor chips 104 and 105 and gold wire 109 connecting the semiconductor chips 104 and 105 are provided by performing a wire bonding step. During wire bonding between the semiconductor chips 104 and 105, it is necessary to hold the semiconductor chips 104 and 105 in a manner that prevents the semiconductor chips 104 and 105 from contacting each other.

Next, as shown in FIG. 11D, a sealing step is performed by a known technique using a sealing mold and a sealing resin 114.

Next, as shown in FIG. 11E, a step of working the lead frame 107 is performed. Packages are isolated from each other along the lead frame 107. A shape of an external connection lead 111 of the lead frame 107 is changed. Thus, a semiconductor device is completed.

As described above, a semiconductor chip is mounted in a resin package, so that the semiconductor chip is allowed to function while electrical connection thereof is protected from external environments (the above description is based on Japanese Unexamined Patent Application Publication No. 2005-347428).

Also, Japanese Unexamined Patent Application Publication No. 2008-28006 discloses a semiconductor device that includes separate die pads and has excellent heat dissipating capability. In this semiconductor device, a common metal plate for heat dissipation is provided for a plurality of die pads, and the heat dissipating metal plate is exposed from a sealing resin. Note that the die pads are provided on the same plane while sharing the heat dissipating metal plate, so that a chip having a larger size than that of a die pad cannot be connected to the die pad, for example.

SUMMARY

The aforementioned semiconductor device has a multi-layered structure in which semiconductor chips three-dimensionally overlap each other, so that the package has a large thickness. Therefore, the semiconductor device has a large height when mounted. Moreover, when two or more semiconductor chips are mounted, an influence of heat generated form each semiconductor chip needs to be taken into consideration. When a semiconductor chip having a large increase in temperature and a semiconductor chip having a small increase in temperature are mounted within the same package, it is necessary to efficiently dissipate heat generated during an operation of the semiconductor chips to the outside. Therefore, it is necessary to achieve a semiconductor device having a structure that reduces the height of layered semiconductor chips and the influence of heat generated from the semiconductor chips.

However, in the arrangement of die pads or the multilayered structure of semiconductor chips in the aforementioned conventional semiconductor device, there is space particularly in a vertical direction between the semiconductor chips. Therefore, the thickness of a package is increased, resulting in an outer shape that is not suitable for high-density packaging. Moreover, such a structure does not allow a heat dissipating structure to mount a semiconductor chip generating a large amount of heat and a semiconductor chip generating a small amount of heat. Therefore, an abnormal operation of the semiconductor device is likely to occur due to heat.

In view of the problems described above, an object of the present disclosure is to provide a semiconductor device having a structure that allows a plurality of semiconductor chips to be mounted within the same package without increasing the thickness of the package, and a method of fabrication thereof.

Also, a semiconductor device is preferably provided that has a structure that allows a plurality of semiconductor chips that have different power consumptions and heat power densities and are provided on a plurality of die pads electrically and thermally isolated from each other, to be mounted within the same package without increasing the thickness of the package. A method of fabrication thereof is preferably provided.

Specifically, the following example means is provided.

A semiconductor device includes a first die pad, a first semiconductor chip provided on the first die pad, a second die pad, a second semiconductor chip provided on the second die pad, and a sealing resin made of a first resin material, sealing the first die pad, the first semiconductor chip, the second die pad and the second semiconductor chip. A lower surface of the first semiconductor chip is connected to the first die pad. A first portion of a lower surface of the second semiconductor chip is connected to the second die pad, and a second portion not connected to the second die pad of the lower surface of the second semiconductor chip is connected to an upper surface of the first semiconductor chip via a second resin material different from the first resin material.

The second resin material refers to a material that prevents heat generated by the first semiconductor chip from transferring to the second semiconductor chip, or heat generated by the second semiconductor chip from transferring to the first semiconductor chip, i.e., a resin material having an adiabatic effect. For example, the second resin material may include a synthetic resin containing a phenol resin, a polyethylene resin, a polypropylene resin or the like as a major component thereof. The second resin material thus defined is equivalent to a thermal insulator as set forth in the appended claims and the specification.

In the semiconductor device, the first and second die pads are preferably electrically isolated from each other. The first and second die pads are preferably provided at positions different from each other in a vertical direction.

In the semiconductor device, one of the first and second die pads is preferably grounded.

In the semiconductor device, a thermal conductivity of the second resin material is lower than a thermal conductivity of the first resin material.

In the semiconductor device, the lower surface of the first die pad is preferably exposed from the sealing resin.

In the semiconductor device, the first semiconductor chip preferably has a high heat generation circuit region having a relatively high amount of heat generated during a circuit operation and a low heat generation circuit region having a relatively low amount of heat generated during the circuit operation. There is preferably space between a region contacting the second resin material of the first semiconductor chip, and the high heat generation circuit region.

In the semiconductor device, a length of the space is preferably larger than or equal to a thickness of the first semiconductor chip.

A method for fabricating a semiconductor device including a plurality of semiconductor chips, includes the steps of (a) providing a first die pad and a second die pad electrically isolated from each other, (b) mounting a first semiconductor chip on an upper surface of the first die pad, and (c) mounting the second semiconductor chip on the second die pad in a manner that contacts a portion of a lower surface of the second semiconductor chip to an upper surface of the second die pad, and a portion extending off the second die pad of the lower surface of the second semiconductor chip to an upper surface of the first semiconductor chip via a thermal insulator.

In the method, the step (c) preferably includes forming the thermal insulator on a portion of the upper surface of the first semiconductor chip before mounting the second semiconductor chip.

According to the semiconductor device and a method of fabrication thereof, a plurality of semiconductor chips can be highly densely mounted within the same package. Moreover, die pads are electrically and thermally isolated from each other. Therefore, even if semiconductor chips have different power consumptions or amounts of generated heat, the semiconductor chips can be less affected by each other. Therefore, it is possible to provide a semiconductor device having stable quality with low cost.

BRIEF DESCRIPTION OF THE DRAWINGS

FIG. 5A is a cross-sectional view schematically showing an internal structure of a third example semiconductor device.

FIG. 5B is a plan view schematically showing a lead frame of the third example semiconductor device.

FIG. 5C is a plan view schematically showing an internal structure of the third example semiconductor device as viewed from the top.

DETAILED DESCRIPTION

Hereinafter, the technical idea of the present disclosure will be described in detail with reference to the accompanying drawings. Various modifications and additions can be made to embodiments disclosed herein without departing the spirit and scope of the present disclosure by those skilled in the art after understanding the present disclosure. Also, a plurality of embodiments described below can be combined in any manner as long as the combination still falls within the spirit and scope of the present disclosure.

First Embodiment

Hereinafter, a first example semiconductor device will be described.

Figure 1A:
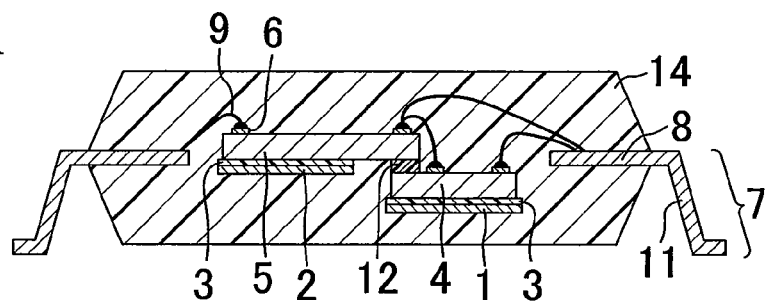
FIG. 1A is a cross-sectional view schematically showing an internal structure of a first example semiconductor device.
Figure 1B:
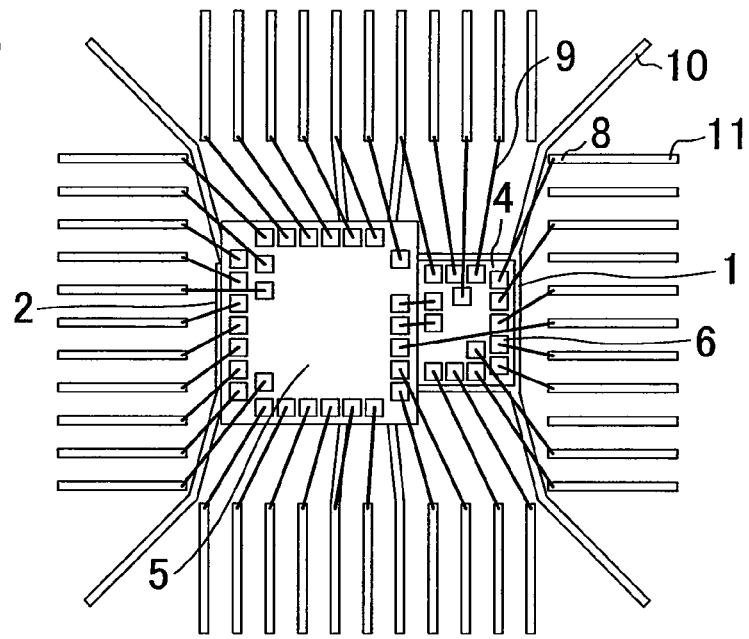
FIG. 1B is a plan view schematically showing a lead frame of the first example semiconductor device.
Figure 1C:
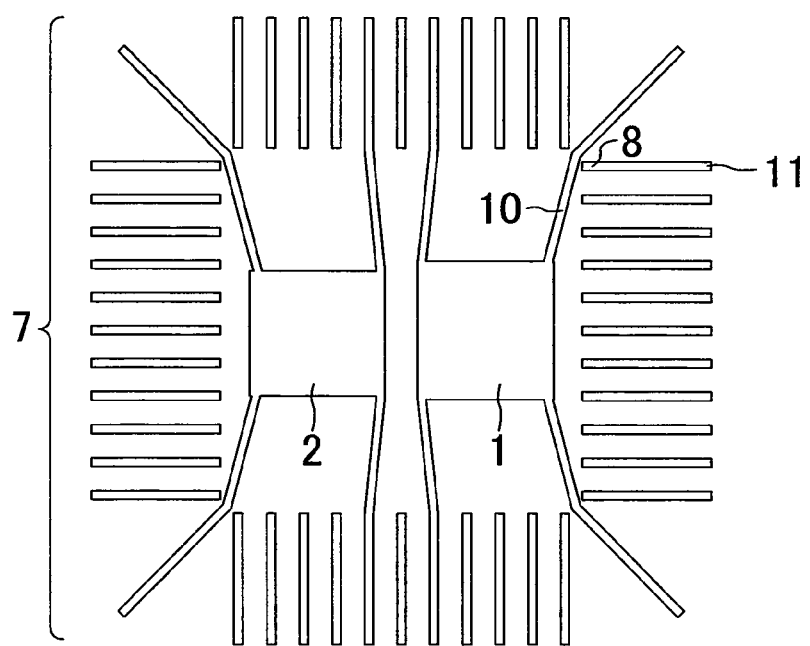
FIG. 1C is a plan view schematically showing an internal structure of the first example semiconductor device as viewed from the top.

FIGS. 1A to 1C are diagrams showing a structure of the first example semiconductor device. FIG. 1A is a cross-sectional view schematically showing an internal structure of the semiconductor device. FIG. 1B is a plan view schematically showing a lead frame of the semiconductor device. FIG. 1C is a plan view schematically showing an internal structure of the semiconductor device as viewed from the top.

As shown in FIG. 1A, this semiconductor device has die pads 1 and 2. The die pads 1 and 2 have a difference in level in a direction perpendicular to a surface thereof on which a semiconductor chip is mounted. In other words, the die pads 1 and 2 are arranged and positioned at different heights in a vertical direction. A semiconductor chip 4 is mounted on the die pad 1 positioned at the lower height in the package of the semiconductor device with an electrically conductive resin 3 being interposed therebetween. In other words, a lower surface of the semiconductor chip 4 is electrically connected to the die pad 1. A semiconductor chip 5 is provided on the die pad 2 positioned above the die pad 1 with an electrically conductive resin 3 being interposed therebetween. A circuit formation surface of the semiconductor chip 4 is connected via a thermal insulator 12 to a lower surface of the semiconductor chip 5. In other words, a portion of the lower surface of the semiconductor chip 5 is electrically connected to the die pad 2, while another portion of the lower surface of the semiconductor chip 5 that is not connected to the die pad 2 is connected via the thermal insulator 12 to the upper surface of the semiconductor chip 4.

Some electrodes 6 on the semiconductor chip 4 are electrically connected via respective gold wires 9 to some respective electrodes 6 on the semiconductor chip 5. The other electrodes 6 on the semiconductor chip 4 and the other electrodes 6 on the semiconductor chip 5 are connected via respective gold wires 9 to respective inner leads 8. The resultant structure is enclosed and sealed with a sealing resin 14 to form a package, from which external connection leads 11 are extended to the outside.

As used herein, the thermal insulator 12 refers to a material that prevents heat generated by the semiconductor chip 4 from transferring via the thermal insulator 12 to the semiconductor chip 5 or heat generated by the semiconductor chip 5 from transferring via the thermal insulator 12 to the semiconductor chip 4 as described above, i.e., a resin material having an adiabatic effect. Moreover, the thermal insulator 12 is preferably a material that is different from a resin material (described below) for the sealing resin 14 and has a lower thermal conductivity than that of the sealing resin 14. A commonly used epoxy resin as a major component of the sealing resin 14 has a thermal conductivity of 0.2 W/m·K, and therefore, the thermal insulator 12 preferably includes a material having a lower thermal conductivity than that of the epoxy resin. For example, the thermal insulator 12 may include a synthetic resin containing a phenol resin, a polyethylene resin, a polypropylene resin or the like as a major component thereof.

Also, as shown in FIG. 1B, in this semiconductor device, the semiconductor chips 4 and 5 contact each other while being layered. As described above, some electrodes 6 on the semiconductor chip 4 are electrically connected via respective gold wires 9 to some respective electrodes 6 on the semiconductor chip 5, and the other electrodes 6 on the semiconductor chip 4 and the other electrodes 6 on the semiconductor chip 5 are connected via respective gold wires 9 to respective inner leads 8. In particular, when the die pads 1 and 2 are connected to the ground (GND), GND terminals of the semiconductor chips 4 and 5 connected to the die pads 1 and 2 are connected via gold wires 9 to inner leads 8 that are electrically connected via suspender leads 10 to the die pads 1 and 2.

Next, as shown in FIG. 1C, in this semiconductor device, the die pads 1 and 2 share no suspender leads 10 in a lead frame 7. Therefore, the die pads 1 and 2 are electrically and thermally isolated from each other. A portion of the suspender leads 10 supporting the die pads 1 and 2 are linked to the corresponding inner leads 8. As a result, when it is desired that the die pads 1 and 2 be connected to GND, the inner leads 8 linked to the suspender leads 10 are connected to GND.

As described above, according to the structure of this semiconductor device, a plurality of semiconductor chips having different power consumptions or heat power densities can be mounted on a plurality of respective die pads that are electrically and thermally isolated from each other, within the same package, without increasing the thickness of the package. Moreover, such a structure allows a heat dissipating structure to mount a semiconductor chip generating a large amount of heat and a semiconductor chip generating a small amount of heat.

Variation of First Embodiment

Figure 2:
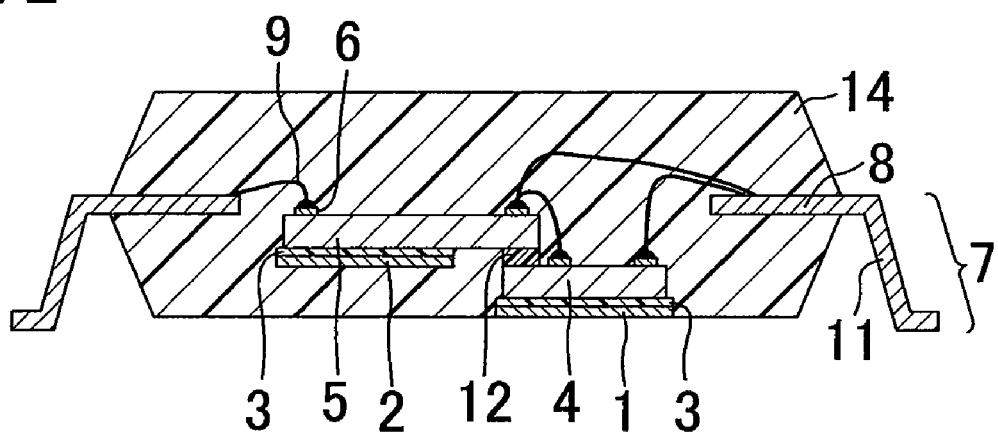
FIG. 2 is a diagram showing a structure of a variation of the first example semiconductor device.

FIG. 2 shows a structure of a variation of the first example semiconductor device.

As shown in FIG. 2, in this semiconductor device, the die pad 1 is exposed from the package of the semiconductor device. Specifically, the die pad 1 is exposed at a portion corresponding to the lowest one of steps of the lead frame 7. Note that the other parts of this semiconductor device are similar to the corresponding parts of FIGS. 1A to 1C and will not be described.

The structure of FIG. 2 is required, particularly when a semiconductor chip has a high heat power density and therefore heat dissipation by the package itself is not enough to operate the semiconductor chip. In this case, the exposed surface of the die pad 1 is connected to a mounting substrate for the semiconductor device using solder so as to forcedly dissipate heat. Specifically, the heat dissipating capability of a semiconductor device that has a power consumption of more than 15 W needs to be increased, though the amount of heat generated in a semiconductor chip varies depending on the packaging density, the chip size, the power consumption, ambient temperature during operation, or the like. Therefore, a semiconductor device having a structure in which a die pad is exposed is useful. A semiconductor device having the structure of FIG. 2 is particularly useful when a memory, and a semiconductor element having a power consumption of more than 15 W are mounted within the same package.

Second Embodiment

Hereinafter, a second example semiconductor device will be described. Note that this second example semiconductor device includes three die pads.

Figure 3A:
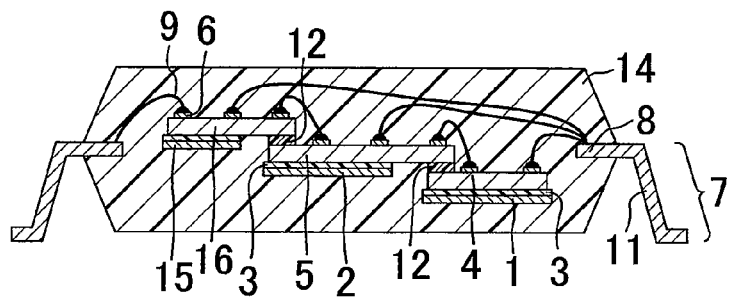
FIG. 3A is a cross-sectional view schematically showing an internal structure of a second example semiconductor device.
Figure 3B:
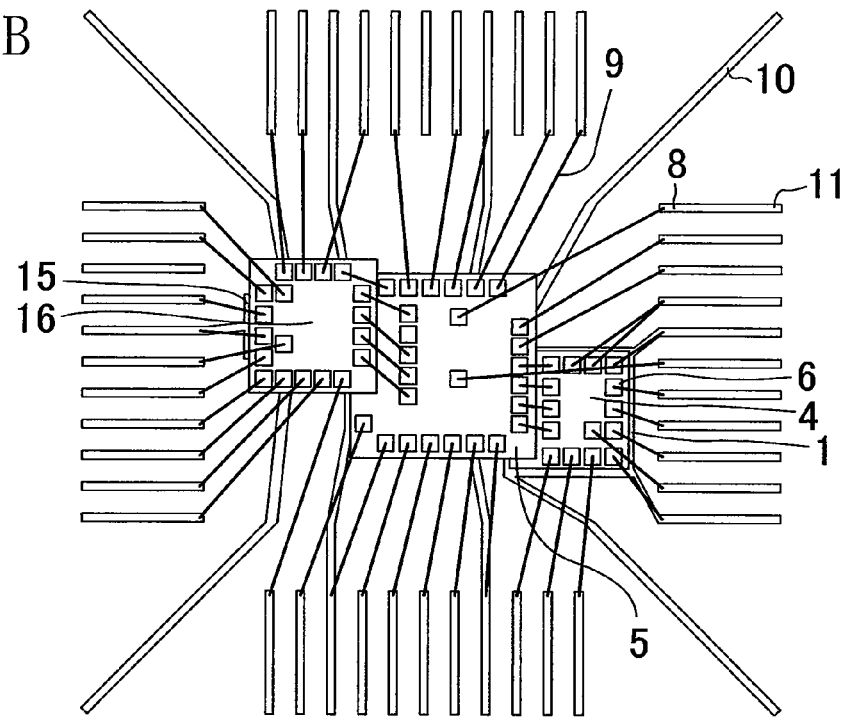
FIG. 3B is a plan view schematically showing a lead frame of the second example semiconductor device.
Figure 3C:
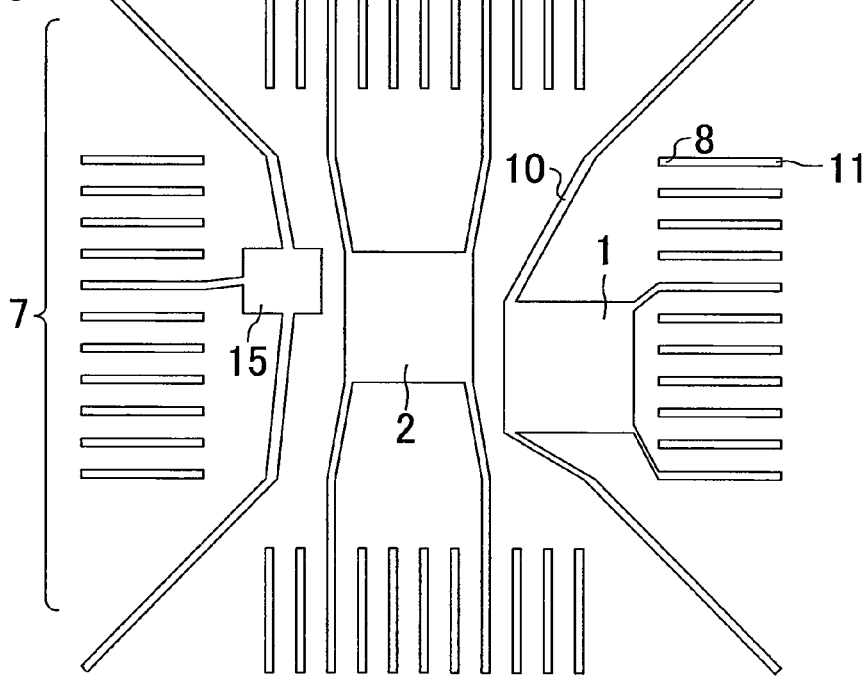
FIG. 3C is a plan view schematically showing an internal structure of the second example semiconductor device as viewed from the top.

FIGS. 3A to 3C are diagrams showing a structure of the second example semiconductor device. FIG. 3A is a cross-sectional view schematically showing an internal structure of the semiconductor device. FIG. 3B is a plan view schematically showing a lead frame of the semiconductor device. FIG. 3C is a plan view schematically showing an internal structure of the semiconductor device as viewed from the top.

As shown in FIG. 3A, the semiconductor device includes die pads 1, 2 and 15. The die pads 1, 2 and 15 have differences in level in a direction perpendicular to a surface thereof on which a semiconductor chip is mounted. In other words, the die pads 1, 2 and 15 are arranged and positioned at different heights in a vertical direction. A semiconductor chip 4 is mounted on the die pad 1 that is provided at the lowest position in the package of the semiconductor device with an electrically conductive resin 3 being interposed therebetween. A semiconductor chip 5 is mounted on the die pad 2 provided above the die pad 1 with an electrically conductive resin 3 being interposed therebetween. A semiconductor chip 16 is mounted on the die pad 15 provided above the die pad 2 with an electrically conductive resin 3 being interposed therebetween. Moreover, a circuit formation surface of the semiconductor chip 4 is connected to a lower surface of the semiconductor chip 5 via a thermal insulator 12. A circuit formation surface of the semiconductor chip 5 is connected to a lower surface of the semiconductor chip 16 via a thermal insulator 12. Specifically, a portion of the lower surface of the semiconductor chip 5 is electrically connected to the die pad 2, while another portion of the lower surface of the semiconductor chip 5 that is not connected to the die pad 2 is connected via the thermal insulator 12 to the upper surface of the semiconductor chip 4. Similarly, a portion of the lower surface of the semiconductor chip 16 is electrically connected to the die pad 15, while another portion of the lower surface of the semiconductor chip 16 that is not connected to the die pad 15 is connected via the thermal insulator 12 to the upper surface of the semiconductor chip 5.

Some electrodes 6 on the semiconductor chip 4 are electrically connected via respective gold wires 9 to some respective electrodes 6 on the semiconductor chip 5. Some electrodes 6 on the semiconductor chip 5 are electrically connected via respective gold wires 9 to some respective electrode 6 on the semiconductor chip 16. The other electrodes 6 on the semiconductor chip 4, the other electrodes 6 on the semiconductor chip 5, and the other electrodes 6 on the semiconductor chip 16 are electrically connected via respective gold wires 9 to respective inner leads 8. The resultant structure is enclosed and sealed with a sealing resin 14 to form a package, from which external connection leads 11 are extended to the outside.

As described above, the thermal insulator 12 as used herein refers to a material that prevents heat generated by the semiconductor chip 4 from transferring via the thermal insulator 12 to the semiconductor chip 5, heat generated by the semiconductor chip 5 from transferring via the thermal insulator 12 to the semiconductor chip 4 or 16, or heat generated by the semiconductor chip 16 from transferring via the thermal insulator 12 to the semiconductor chip 5, i.e., a resin material having an adiabatic effect. Moreover, the thermal insulator 12 is preferably a material that is different from a resin material (described below) for the sealing resin 14 and has a lower thermal conductivity than that of the sealing resin 14. A commonly used epoxy resin as a major component of the sealing resin 14 has a thermal conductivity of 0.2 W/m·K, and therefore, the thermal insulator 12 preferably includes a material having a lower thermal conductivity than that of the epoxy resin. For example, the thermal insulator 12 may include a synthetic resin containing a phenol resin, a polyethylene resin, a polypropylene resin or the like as a major component thereof.

Although it has been assumed above that the number of semiconductor chips mounted within the same package is three, more than three semiconductor chips may be mounted within the same package. This can be similarly achieved by increasing the number of layers (steps) in the aforementioned multi-layered (staircase-like) structure.

Also, as shown in FIG. 3B, in this semiconductor device, the semiconductor chips 4, 5 and 16 contact each other while being layered. As described above, some electrodes 6 on the semiconductor chip 4 are electrically connected via respective gold wires 9 to some respective electrodes 6 on the semiconductor chip 5, and some electrodes 6 on the semiconductor chip 5 are electrically connected via respective gold wires 9 to some respective electrodes 6 on the semiconductor chip 16. The other electrodes 6 on the semiconductor chip 4, the other electrode 6 on the semiconductor chip 5, and the other electrodes 6 on the semiconductor chip 16 are electrically connected via respective gold wires 9 to respective inner leads 8.

Next, as shown in FIG. 3C, in this semiconductor device, the die pads 1, 2 and 15 share no suspender leads 10 in a lead frame 7. Therefore, the die pads 1, 2 and 15 are electrically and thermally isolated from each other. A portion of the suspender leads 10 supporting the die pads 1, 2 and 15 are linked to the corresponding inner leads 8. As a result, when it is desired that the die pads 1, 2 and 15 be connected to GND, the inner leads 8 linked to the suspender leads 10 are connected to GND.

As described above, according to the structure of this semiconductor device, a plurality of semiconductor chips having different power consumptions or heat power densities can be mounted on a plurality of respective die pads that are electrically and thermally isolated from each other, within the same package, without increasing the thickness of the package. Moreover, such a structure allows a heat dissipating structure to mount a semiconductor chip generating a large amount of heat and a semiconductor chip generating a small amount of heat.

Variation of Second Embodiment

Figure 4:
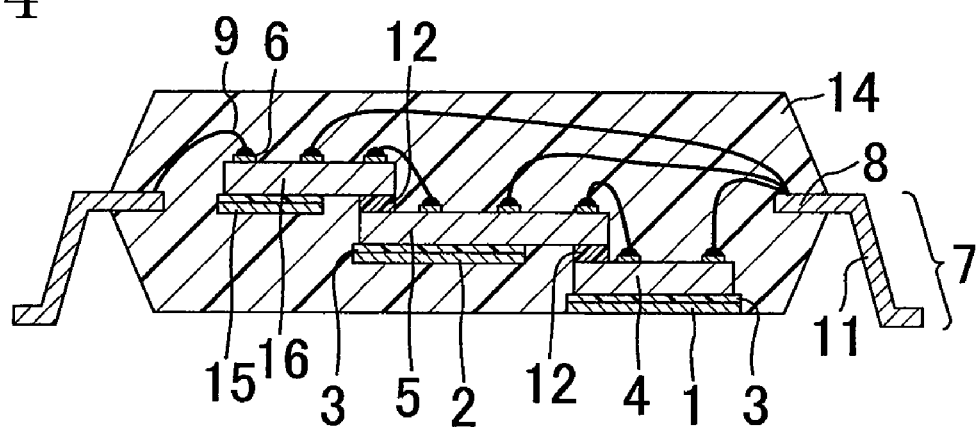
FIG. 4 is a diagram showing a structure of a variation of the second example semiconductor device.

FIG. 4 shows a structure of a variation of the second example semiconductor device.

As shown in FIG. 4, in this semiconductor device, the die pad 1 is exposed from the package of the semiconductor device. Specifically, the die pad 1 is exposed at a portion corresponding to the lowest one of steps of the lead frame 7. Note that the other parts of this semiconductor device are similar to the corresponding parts of FIGS. 3A to 3C and will not be described. The structure of this variation has advantages similar to those which have been described using the structure of FIG. 2.

Third Embodiment

Hereinafter, a third example semiconductor device will be described. Note that the third example semiconductor device has three die pads, two of which are positioned at the same height.

FIGS. 5A to 5C are diagrams showing a structure of the third example semiconductor device. FIG. 5A is a cross-sectional view schematically showing an internal structure of the semiconductor device. FIG. 5B is a plan view schematically showing a lead frame of the semiconductor device. FIG. 5C is a plan view schematically showing an internal structure of the semiconductor device as viewed from the top.

As shown in FIG. 5A, this semiconductor device has die pads 1, 2 and 15. The die pads 1 and 15 are arranged and positioned at the same height. The semiconductor chips 4 and 16 are mounted on the die pads 1 and 15 provided at the lower position in the package of the semiconductor device with electrically conductive resins 3 being interposed therebetween, respectively. A semiconductor chip 5 is mounted on the die pad 2 provided above the die pads 1 and 15 with an electrically conductive resin 3 being interposed therebetween. Circuit formation surfaces of the semiconductor chips 4 and 16 are connected via respective thermal insulators 12 to a lower surface of the semiconductor chip 5. Specifically, a middle portion of the lower surface of the semiconductor chip 5 is electrically connected to the die pad 2, while peripheral portions of the lower surface of the semiconductor chip 5 that are not connected to the die pad 2 are connected via the thermal insulators 12 to upper surfaces of the semiconductor chips 4 and 16.

Some electrodes 6 on the semiconductor chip 4 are electrically connected via respective gold wires 9 to some respective electrodes 6 on the semiconductor chip 5. Some electrodes 6 on the semiconductor chip 5 are electrically connected via respective gold wires 9 to some respective electrodes 6 of the semiconductor chip 16. The other electrodes 6 on the semiconductor chip 4, the other electrode 6 on the semiconductor chip 5, and the other electrodes 6 on the semiconductor chip 16 are electrically connected via respective gold wires 9 to respective inner leads 8. The resultant structure is enclosed and sealed with a sealing resin 14 to form a package, from which external connection leads 11 are extended to the outside. The thermal insulator 12 is made of a material which has been described in the second embodiment. Although it has been assumed above that the number of semiconductor chips mounted within the same package is three, more than three semiconductor chips may be mounted within the same package. This can be similarly achieved by providing a structure in which some die pads are arranged at the same height as described above.

Also, as shown in FIG. 5B, in this semiconductor device, the semiconductor chips 4, 5 and 16 contact each other while being layered. As described above, some electrodes 6 on the semiconductor chip 4 are electrically connected via respective gold wires 9 to some respective electrodes 6 on the semiconductor chip 5, and some electrodes 6 on the semiconductor chip 5 are electrically connected via respective gold wires 9 to some respective electrodes 6 on the semiconductor chip 16. The other electrodes 6 on the semiconductor chip 4, the other electrode 6 on the semiconductor chip 5, and the other electrodes 6 on the semiconductor chip 16 are electrically connected via respective gold wires 9 to respective inner leads 8.

Also, as shown in FIG. 5C, in this semiconductor device, the die pads 1, 2 and 15 share no suspender leads 10 in a lead frame 7. Therefore, the die pads 1, 2 and 15 are electrically and thermally isolated from each other. A portion of the suspender leads 10 supporting the die pads 1, 2 and 15 are linked to the corresponding inner leads 8. As a result, when it is desired that the die pads 1, 2 and 15 be connected to GND, the inner leads 8 linked to the suspender leads 10 are connected to GND.

As described above, according to the structure of this semiconductor device, a plurality of semiconductor chips having different power consumptions or heat power densities can be mounted on a plurality of respective die pads that are electrically and thermally isolated from each other, within the same package, without increasing the thickness of the package. Moreover, such a structure allows a heat dissipating structure to mount a semiconductor chip generating a large amount of heat and a semiconductor chip generating a small amount of heat. Also, although the structure of FIGS. 3A to 3C has a thickness corresponding to the sum of the heights of three semiconductor chips, the structure of FIGS. 5A to 5C has a thickness corresponding to the sum of the heights of two semiconductor chips. Therefore, the thickness of the semiconductor device of FIGS. 5A to 5C can be reduced as compared to the structure of FIGS. 3A to 3C.

Variation of Third Embodiment

Figure 6:
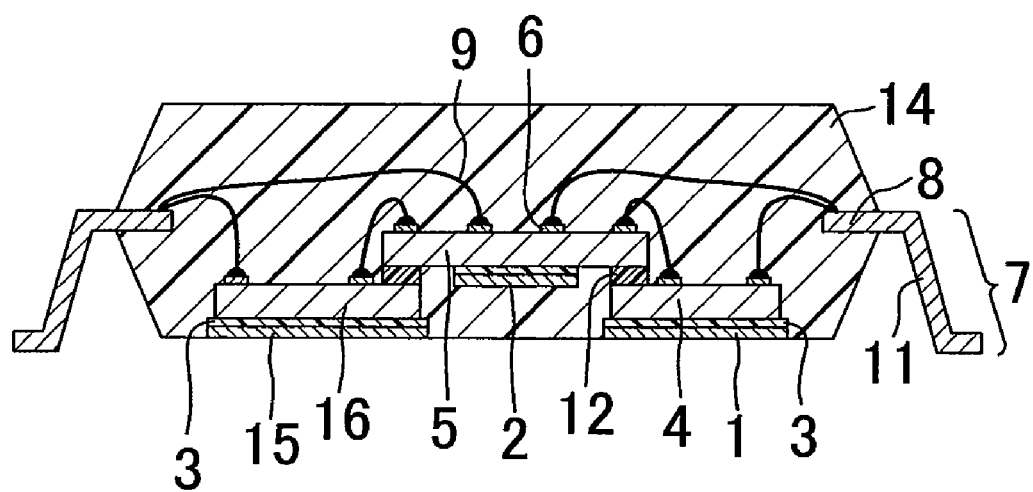
FIG. 6 is a diagram showing a structure of a variation of the third example semiconductor device.

FIG. 6 shows a structure of a variation of the third example semiconductor device.

As shown in FIG. 6, in this semiconductor device, the die pads 1 and 15 are exposed from the package of the semiconductor device. Specifically, the die pads 1 and 15 are exposed at a portion corresponding to the lowest one of steps of the lead frame 7. Note that the other parts of this semiconductor device are similar to the corresponding parts of FIGS. 5A to 5C and will not be described. The structure of this variation has advantages similar to those which have been described using the structure of FIG. 2. Moreover, although the structure of FIG. 4 has a thickness corresponding to the sum of the heights of three semiconductor chips, the structure of FIG. 6 has a thickness corresponding to the sum of the heights of two semiconductor chips. Therefore, the thickness of the semiconductor device of FIG. 6 can be reduced as compared to the structure of FIG. 4.

Fourth Embodiment

Hereinafter, a structure of a fourth example semiconductor device will be described. Note that a positional relationship between contact regions of semiconductor chips in a circuit configuration of the semiconductor chips when heat power densities are distributed in a semiconductor chip, will be described. This embodiment is applicable to all of the embodiments above.

Figure 7A:
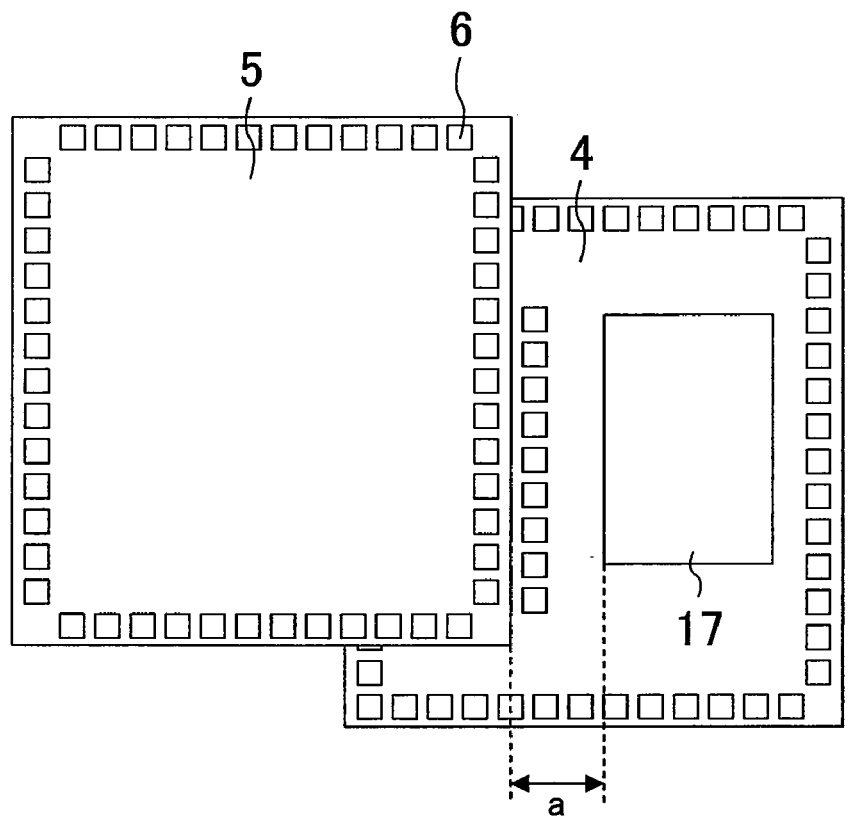
FIG. 7A is a diagram showing a two-dimensional arrangement of semiconductor chips in a fourth example semiconductor device.
Figure 7B:
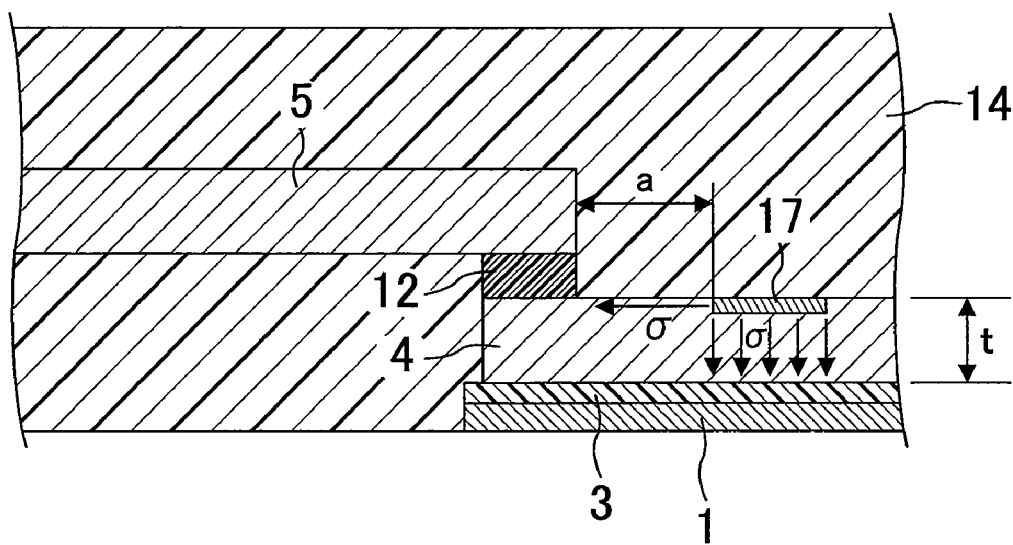
FIG. 7B is a diagram showing a cross-sectional arrangement of the semiconductor chips in the fourth example semiconductor device, schematically showing how heat transfers.

FIG. 7A shows a two-dimensional arrangement of chips in this semiconductor device. FIG. 7B shows a cross-sectional arrangement of the chips in this semiconductor device, schematically showing how heat transfers.

As shown in FIG. 7A, when there is a high heat generation circuit area 17 having a high heat power density of a circuit configured in a semiconductor chip 4, a distance between a semiconductor chip 5 and the high heat generation circuit area 17, and a thickness t of the semiconductor chip 4 need to satisfy a relationship a>t.

Here, the relationship a>t will be described with reference to FIG. 7B.

A time that it takes for heat to transfer from the high heat generation area 17 to a lower surface the semiconductor chip 4 is $sR=t/\sigma$, where $\sigma$ represents a heat transfer rate in the semiconductor chip. A time that it takes for heat to transfer from the high heat generation area 17 to the semiconductor chip 5 is $sC=a/\sigma$. If a>t, then sR<sC. In other words, the time that it takes for heat to transfer from the high heat generation area 17 to the lower surface of the semiconductor chip 4 is shorter than the time that it takes for heat to transfer from the high heat generation area 17 to the semiconductor chip 5.

In this case, if the lower surface of the semiconductor chip 4 is connected to a die pad 1, is exposed from a sealing resin 14 as in the variation of each embodiment above, and is attached to a mounting substrate with solder, heat dissipated from the high heat generation area 17 is allowed to transfer to the die pad 1 having higher heat dissipating capability through the shorter transfer path, which makes it difficult for heat to transfer to the semiconductor chip 5.

Fifth Embodiment

Hereinafter, a method for fabricating a fifth example semiconductor device will be described. The fifth example semiconductor device is assumed to have the structure of FIG. 2, for example.

FIGS. 8A to 8D and 9A to 9D are cross-sectional views showing the method for fabricating the fifth example semiconductor device in the order in which steps thereof are performed.

Figure 8A:
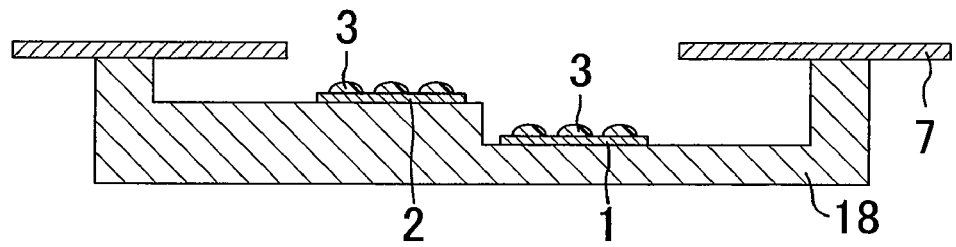
FIGS. 8A to 8D are cross-sectional views showing a method for fabricating a fifth example semiconductor device in the order in which steps thereof are performed.

Initially, as shown in FIG. 8A, a lead frame 7 having two die pads 1 and 2 that have a difference in level in a direction perpendicular to a main surface of the die pad on which a semiconductor chip is to be mounted (i.e., the die pads 1 and 2 are positioned at different height in a vertical direction), is placed on a lead frame holding plate 18 having a shape fitting the desired heights of the die pads 1 and 2. Next, an electrically conductive resin 3 is applied onto the semiconductor chip mounting surfaces of the die pads 1 and 2. In this step, an electrically conductive paste is applied onto both of the die pads 1 and 2. The electrically conductive paste may be an Ag paste containing Ag particles.

Figure 8B:
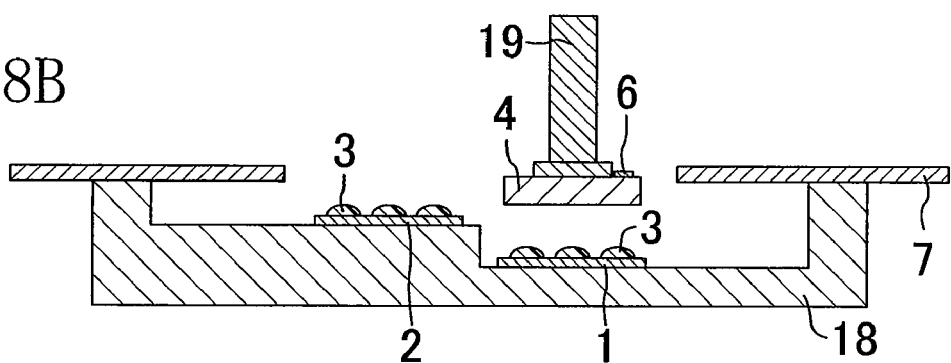

Next, as shown in FIG. 8B, a semiconductor chip 4 having electrodes 6 on an upper surface thereof is mounted on the die pad 1 provided at the lower position. Specifically, the semiconductor chip 4 suction-attached to a collet 19 is mounted onto the die pad 1. Note that semiconductor chips are mounted onto die pads in order of die pad height, lowest first (the lowest die pad 1 first).

Figure 8C:
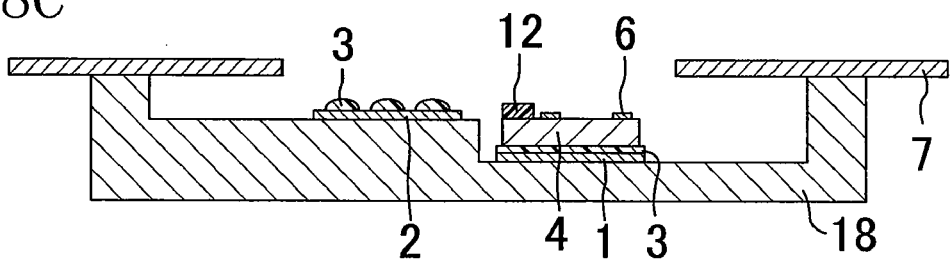

Next, as shown in FIG. 8C, a thermal insulator 12 is formed in a region where a circuit formation surface of the semiconductor chip 4 and a semiconductor chip 5 described below contact each other. Note that the thermal insulator 12 is similar to that which has been described above with reference to FIG. 2.

Figure 8D:
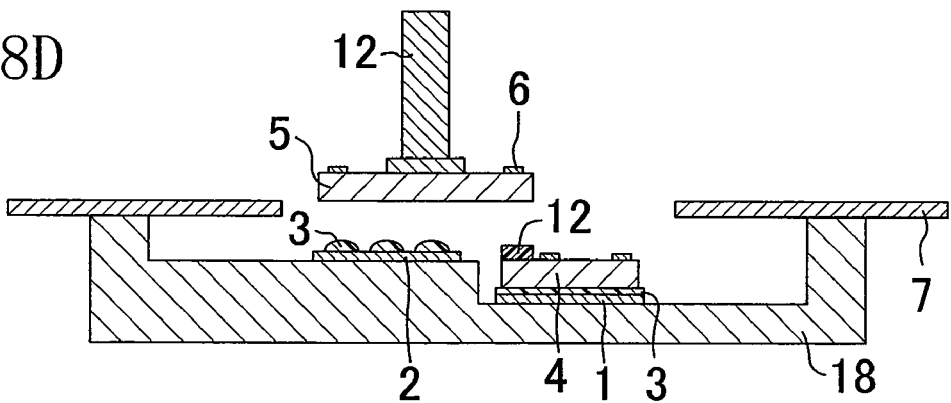

Next, as shown in FIG. 8D, the semiconductor chip 5 suction-attached to the collet 19 is mounted onto the die pad 2 while a lower surface of the semiconductor chip 5 is attached to the thermal insulator 12 on the semiconductor chip 4. As a result, a portion of the lower surface of the semiconductor chip 5 is electrically connected to the die pad 2 while another portion of the lower surface of the semiconductor chip 5 that is not connected to the die pad 2 is connected via the thermal insulator 12 to the upper surface of the semiconductor chip 4 (see FIG. 9A).

Figure 9A:
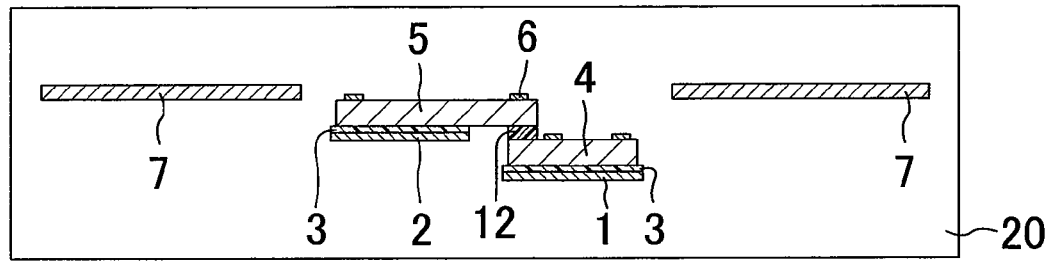
FIGS. 9A to 9D are cross-sectional views showing the method for fabricating the fifth example semiconductor device in the order in which steps thereof are performed.

Next, as shown in FIG. 9A, the lead frame 7 on which the semiconductor chips 4 and 5 are mounted is placed in a curing furnace 20, followed by heating. As a result, the heating cures an adhesive layer of the electrically conductive resin 3 and the thermal insulator 12. Note that the heating is preferably performed under conditions that prevent a void from remaining in the electrically conductive resin 3.

Figure 9B:
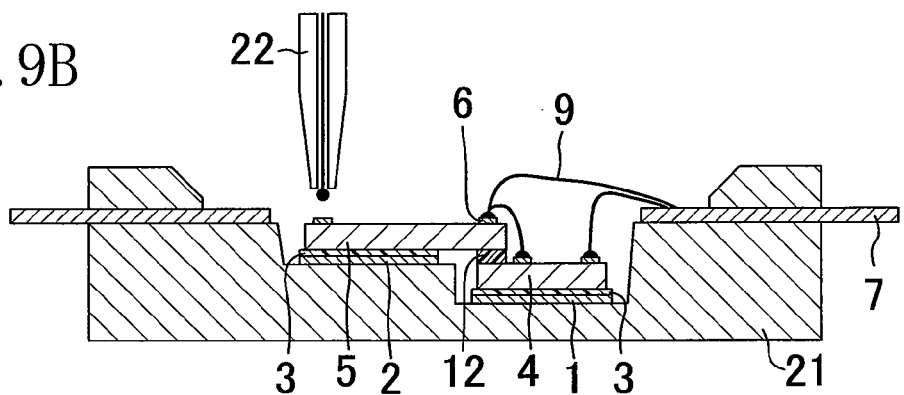

Next, as shown in FIG. 9B, the lead frame 7 on which the semiconductor chips 4 and 5 are mounted is fixed onto a wire bonding stage 21, and gold wires 9 are formed by wire bonding using a capillary 22. Wire bonding is performed between the semiconductor chip 4 and the semiconductor chip 5 prior to between the semiconductor chips 4 and 5 and the lead frame 7.

Figure 9C:
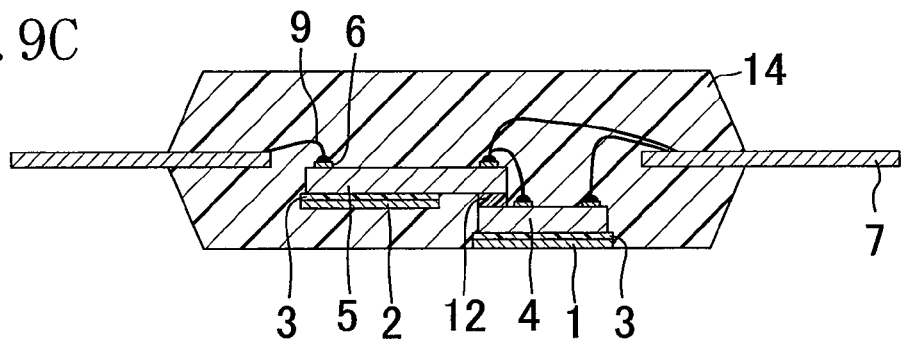

Next, as shown in FIG. 9C, a sealing resin 14 is injected into the resultant structure using a sealing mold similar to that of the conventional art (sealing step). Here, the die pad 1 is exposed from the package as shown in FIG. 2.

Figure 9D:
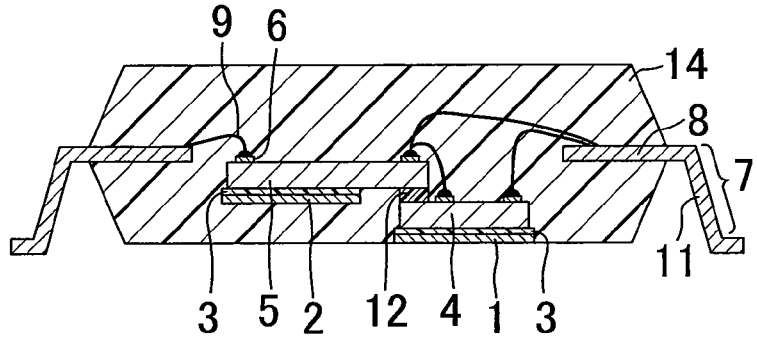
Figure 10A:
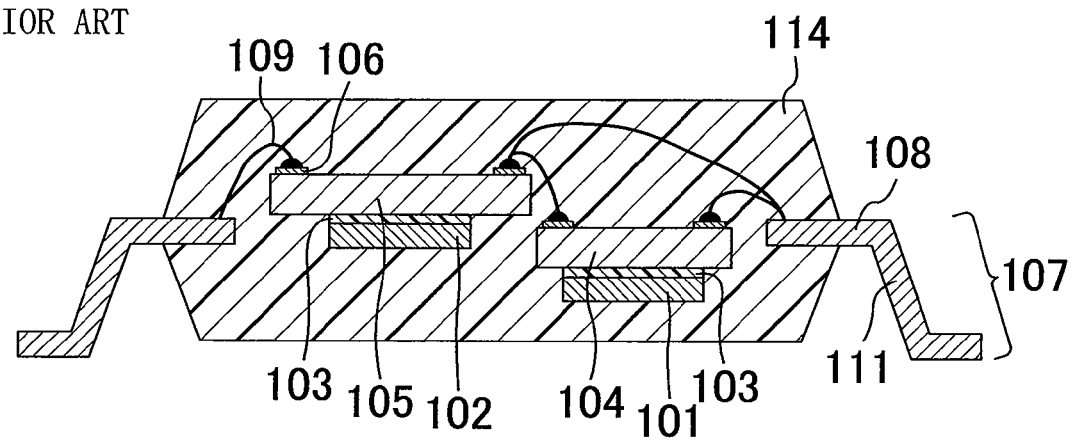
FIGS. 10A and 10B are cross-sectional views showing a structure of a QFP package as a conventional semiconductor device.
Figure 10B:
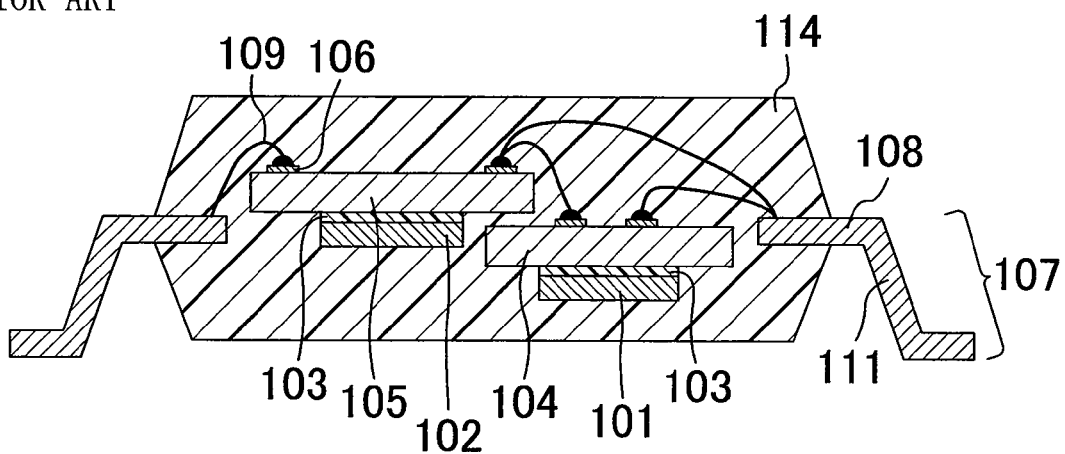
Figure 11A:
FIGS. 11A to 11E are cross-sectional views showing a method for fabricating a QFP package as a conventional semiconductor device in the order in which steps thereof are performed.
Figure 11B:
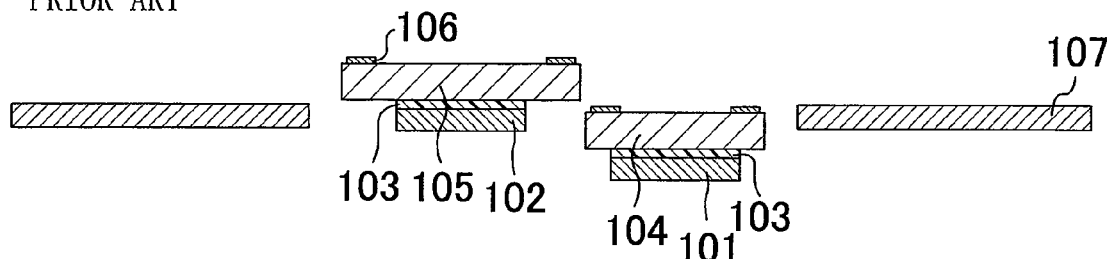
Figure 11C:
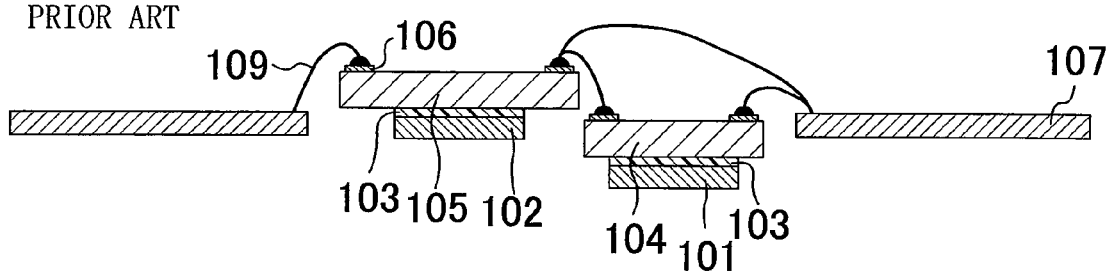
Figure 11D:
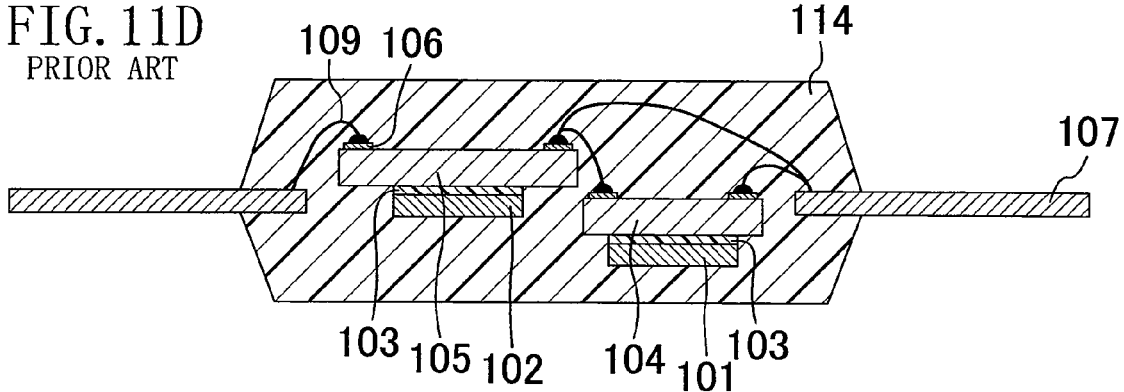
Figure 11E:
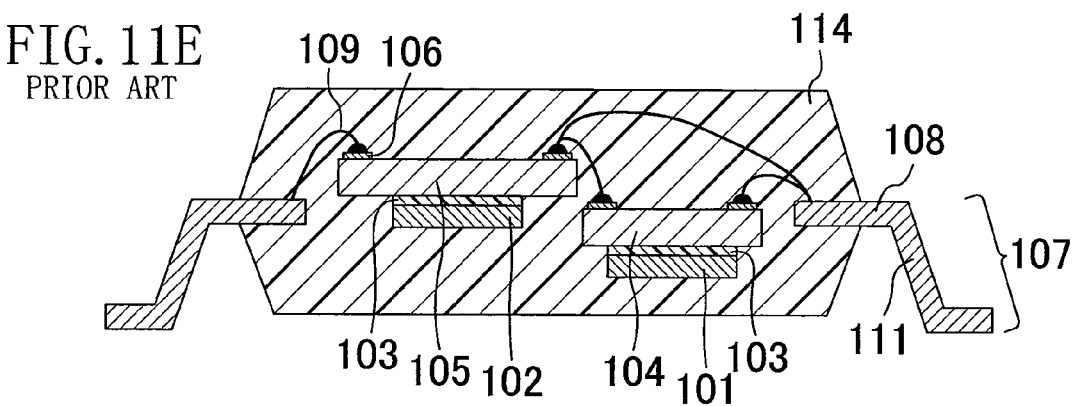

Next, as shown in FIG. 9D, a working step similar to that of the conventional art is performed. In an assembly step, it is important to cause a shape of a jig for holding the lead frame 7 having die pads with semiconductor chip mounting surfaces having different heights in the semiconductor chip mounting step or the wire bonding step, to correspond to the difference between the heights.

As described above, according to this semiconductor device fabricating method, a plurality of semiconductor chips having different power consumptions or heat power densities can be mounted on a plurality of respective die pads that are electrically and thermally isolated from each other, within the same package, without increasing the thickness of the package. Moreover, such a structure allows a heat dissipating structure to mount a semiconductor chip generating a large amount of heat and a semiconductor chip generating a small amount of heat.

Although a method for fabricating a semiconductor device having the structure of FIG. 2 has been described above as an example, a method for fabricating semiconductor devices that have the structures of FIGS. 1 and 3 to 6 and exhibit the aforementioned effect can be contemplated based on this embodiment. For example, when there are three ore more die pads, an electrically conductive resin may be applied onto all of the die pads, semiconductor chips and thermal insulators 12 may be alternately mounted (e.g., in order of the semiconductor chip 4, the thermal insulator 12, the semiconductor chip 5, the thermal insulator 12, and the semiconductor chip 6). Moreover, the thermal insulator 12 may be previously formed on the circuit formation surface of a semiconductor chip when the semiconductor chip is still of a wafer, instead of being formed after the semiconductor chip is mounted on a die pad.

The technique of the present disclosure is useful for a multifunctional semiconductor device, specifically a semiconductor device including a plurality of semiconductor chips within the same package and a method of fabrication thereof.

What is claimed is:

1. A semiconductor device comprising:
   a first die pad;
   a first semiconductor chip provided on the first die pad;
   a second die pad;

a second semiconductor chip provided on the second die pad; and a sealing resin made of a first resin material, sealing the first die pad, the first semiconductor chip, the second die pad and the second semiconductor chip, wherein a lower surface of the first semiconductor chip is connected to the first die pad, and a first portion of a lower surface of the second semiconductor chip is connected to the second die pad, and a second portion not connected to the second die pad of the lower surface of the second semiconductor chip is connected to an upper surface of the first semiconductor chip via a second resin material different from the first resin material.

2. The semiconductor device of claim 1, wherein the first and second die pads are electrically isolated from each other, and the first and second die pads are provided at positions different from each other in a vertical direction.

3. The semiconductor device of claim 1, wherein one of the first and second die pads is grounded.

4. The semiconductor device of claim 1, wherein a thermal conductivity of the second resin material is lower than a thermal conductivity of the first resin material.

5. The semiconductor device of claim 1, wherein the lower surface of the first die pad is exposed from the sealing resin.

6. The semiconductor device of claim 1, wherein the first semiconductor chip has a high heat generation circuit region having a relatively high amount of heat generated during a circuit operation and a low heat generation circuit region having a relatively low amount of heat generated during the circuit operation, and there is space between a region contacting the second resin material of the first semiconductor chip, and the high heat generation circuit region.

7. The semiconductor device of claim 6, wherein a length of the space is larger than or equal to a thickness of the first semiconductor chip.

* * * * *